United States Patent [19]
Murnick

[11] Patent Number: 5,595,583
[45] Date of Patent: Jan. 21, 1997

[54] APPARATUS FOR LOCALIZED SURFACE GLAZING OF CERAMIC ARTICLES

[75] Inventor: Daniel E. Murnick, Bernardsville, N.J.

[73] Assignee: Rutgers, The State University, Piscataway, N.J.

[21] Appl. No.: 391,610

[22] Filed: Feb. 21, 1995

Related U.S. Application Data

[62] Division of Ser. No. 15,568, Feb. 9, 1993, Pat. No. 5,427,825.

[51] Int. Cl.⁶ .................................................. C03C 23/00
[52] U.S. Cl. .................... 65/350; 65/28; 65/33.2; 65/60.1; 65/60.8; 65/349; 219/121.16; 219/121.76; 219/121.77; 219/121.8; 219/121.82
[58] Field of Search .................................... 427/553, 554, 427/555, 557; 65/28, 33.1, 33.2, 33.4, 33.6, 60.8; 219/121.16, 121.6, 121.61, 121.65, 121.76, 121.77, 121.78, 121.79, 121.8, 121.82; 465/117, 349, 350

[56] References Cited

U.S. PATENT DOCUMENTS

| | | | |
|---|---|---|---|
| 2,968,723 | 1/1961 | Steigerwald | 65/33.2 X |
| 3,454,386 | 7/1969 | Ernsberger | 65/33.2 |
| 3,615,317 | 10/1971 | Jagodzinski et al. | 65/30 |
| 3,615,318 | 10/1971 | Jagodzinski et al. | 65/30 |
| 3,663,793 | 5/1972 | Petro et al. | 219/121 LM |
| 4,134,747 | 1/1979 | Pierson et al. | 65/30 R |
| 4,338,114 | 7/1982 | Brockway et al. | 65/28 |
| 4,340,654 | 7/1982 | Campi | 430/5 |

(List continued on next page.)

FOREIGN PATENT DOCUMENTS

| | | |
|---|---|---|
| 0114691 | 1/1984 | European Pat. Off. . |
| 1174167 | 3/1959 | France . |
| 2059732 | 6/1971 | France . |
| 2299417 | 8/1976 | France . |
| 3325251 | 1/1985 | Germany . |
| 294806 | 2/1971 | U.S.S.R. . |
| WO9312049 | 7/1993 | WIPO . |

OTHER PUBLICATIONS

"The Importance of Thermal Stresses and Strains Induced In Laser Process With Focus On Gaussian Beams", J. Appl. Phys. 64(11), 1 Dec. 1988.
"Laser Surface Treatment of Ceramic Coatings", Materials Science and Engineering, 1989 (no month avail).
Ceramic Engineering and Science Proceedings, vol. 5, No. 11, Nov. 1984, Columbus, Ohio, U.S.A. "Laser Spot Glazing of Whitewares".
Chemical Abstracts, vol. 111, No. 20, Nov. 13, 1989, Columbus, Ohio, U.S.A.
Chemical Abstracts, vol. 115, No. 10, Sep. 9, 1991, Columbus, Ohio, U.S.A.
Database WPI, Derwent Publications Ltd., London, GB, Class L02 (Abstract), May–1986.

*Primary Examiner*—Donald E. Czaja
*Assistant Examiner*—Sean Vincent
*Attorney, Agent, or Firm*—Lerner, David, Littenberg, Krumholz & Mentlik

[57] ABSTRACT

A surface of a ceramic article, such as a glazed surface on a whiteware article, is treated with radiant energy such as infrared light from a laser to provide a localized remelting of the material at the surface in a fusing step. After the fusing step, the surface is treated with further radiant energy, desirably over a larger surface encompassing the fused zone and also desirably at a lower power density so as to limit the rate of cooling of the fusion zone and the immediately surrounding regions, thereby preventing thermal stress cracking. The fusion zone and surrounding regions desirably are preheated by additional radiant energy immediately prior to the fusing step so as to further limit thermal stresses during the fusing step. The process can be employed, among many other uses, for repair of glaze defects and for decoration.

4 Claims, 2 Drawing Sheets

U.S. PATENT DOCUMENTS

| | | | |
|---|---|---|---|
| 4,372,989 | 2/1983 | Menzel | 427/53.1 |
| 4,441,008 | 4/1984 | Chan | 219/121 LL |
| 4,443,493 | 4/1984 | Delfino | 427/53.1 |
| 4,496,608 | 1/1985 | Biegelsen et al. | 427/53.1 |
| 4,542,037 | 9/1985 | Delfino | 427/53.1 |
| 4,543,270 | 9/1985 | Oprysko et al. | 427/53.1 |
| 4,547,256 | 10/1985 | Gurtler et al. | 156/603 |
| 4,562,332 | 12/1985 | Walter et al. | 219/121 EM |
| 4,609,566 | 9/1986 | Hongo et al. | 427/53.1 |
| 4,617,206 | 10/1986 | Haisma et al. | 427/374.1 |
| 4,704,304 | 11/1987 | Amendola et al. | 427/57 |
| 4,731,254 | 3/1988 | Heineken et al. | 427/53.1 |
| 4,756,927 | 7/1988 | Black et al. | 427/53.1 |
| 4,814,575 | 3/1989 | Petitbon | 219/121.84 |
| 4,847,138 | 7/1989 | Boylan et al. | 428/209 |
| 4,888,302 | 12/1989 | Ramesh | 437/82 |
| 4,938,996 | 7/1990 | Ziv et al. | 427/53.1 |
| 4,957,775 | 9/1990 | Black et al. | 427/53.1 |
| 5,103,073 | 4/1992 | Danilov et al. | 219/121.68 |

APPARATUS FOR LOCALIZED SURFACE GLAZING OF CERAMIC ARTICLES

This is a division of application Ser. No. 08/015,568 filed Feb. 9, 1993 now U.S. Pat. No. 5,427,825.

FIELD OF THE INVENTION

The present invention relates to the field of ceramics, and more particularly relates to techniques for localized glazing of ceramic articles. Techniques according to the present invention are particularly useful in repair of glaze defects.

BACKGROUND OF THE INVENTION

Many ceramic articles of commerce are provided with smooth, glassy ceramic finishes commonly referred to as glazes. Merely by way of example, ceramic plumbing supplies such as bath tubs, sinks and toilets, commonly referred to in the ceramic trade as "white ware," have glaze over an underlying ceramic structure. The glaze on such articles is important for both aesthetic and functional reasons. Defects in the glaze, such as fissures or cracks can mar the appearance of the article and can also create sanitary difficulties, corrosion, and other functional problems in use. Thus, substantial defects in the glaze render the article unsealable and require that the article either be scrapped or else reworked to repair the glaze.

Common rework processes involve application of a powdered material or frit having composition similar to the glaze layer to be repaired, followed by refiring of the entire article. In essence, the refiring process involves repetition of the firing process originally used to form the glaze layer, i.e. heating of the entire article to a temperature above the reflow temperature of the glaze layer, followed by slow, progressive cooling of the article. The cost of such a refiring step is a major portion of the cost of the original article. The ceramics industry therefore has long sought a more practical repair process.

Various attempts have been made to repair glaze defects with non-ceramic materials, such as paints or epoxies. These methods avoid the refiring step, but pose other difficulties with respect to chemical compatibility, color matching of the repair with the original glaze and durability of the repair. Brockway et al, U.S. Pat. No. 4,338,114 and Heineken et al, U.S. Pat. No. 4,731,254 both disclose use of a laser beam to melt a localized region of a glass article surrounding a crack, scratch or other defect, thereby causing local melting of the glass and repairing the article. Both of these patents explicitly require that the entire article be preheated to about the softening temperature before exposure to the laser beam. This mitigates the thermal stresses occurring during the localized heating by the laser and the subsequent cooling of the locally-heated region. The need for such preheating is a very substantial drawback. Thus, the preheating and the required slow cooling after preheating, would be essentially as expensive as the refiring process without the laser treatment.

Petitbon, U.S. Pat. No. 4,814,575 and the corresponding article by Petitbon et al, "Laser Surface Treatment of Ceramic Coatings", Materials Science and Engineering, A121, pp. 545–548 (1989) disclose processes for treating zirconia coatings such as those used on turbine blades and diesel engine parts. In these processes, a laser beam is swept across the surface while powdered alumina is dispensed in the beam. The powdered alumina melts, apparently along with some of the zirconia of the original article, thereby forming a combined phase at the surface. These references do not specify the bulk temperature of the base zirconia layer during the process or the particular configuration of the laser beam. The patent employs very rapid scanning, so that the laser typically interacts with any point on the surface for considerably less than 1s, and typically less than 0.1s. The ultimate conclusion as stated in the Petitbon article is that even with a relatively robust material such as zirconia, "random microcracking" occurs unless there is "reactive treatments with chemical modifications of the zirconia surface" as provided by the alumina powder. Manifestly, this work does not offer any suggestion that its techniques could be applied to ordinary ceramics such as those used in the whiteware industry, or, particularly, to the glazes applied to articles such as whiteware.

Attempts have been made heretofore to devise a scheme for localized reglazing of defective whiteware products by application of a laser beam, using theoretical predictions of the heat transfer and stresses induced by various beam conditions. These attempts have shown that any beam conditions which succeed in melting the glaze will also result in cracking of the article, i.e., that the process is impossible.

Thus, there are still very substantial, unmet needs for improved methods and apparatus to locally glaze the surfaces of ceramic articles and, particularly, to locally reglaze the surfaces of articles such as whiteware having glaze defects.

SUMMARY OF THE INVENTION

The present invention addresses these needs:

One aspect of the present invention relates to methods of locally glazing the surfaces of ceramic articles. The term "ceramics" as used in this disclosure refers to substantially inorganic nonmetallic material. Ceramics include, but are not limited to, materials such as pottery, porcelain, refractories, structural clay products, porcelain enamels, cements, glass, glass-ceramics, electrooptic ceramics, enamels, ceramic carbides, borides and nitrides, ferroelectric ceramics, and non-silicate glasses. Further, the term "ceramic" as used herein also includes composites incorporating appreciable amounts of ceramic materials together with other materials, such as metal-ceramic compositions. Methods according to this aspect of the present invention desirably include the steps of fusing ceramic material at the location to be glazed by applying radiant energy, referred to herein as "fusing radiant energy" to a fusion zone on the surface of the article encompassing such location, and then annealing the fusion zone by applying further radiant energy, referred to herein as "annealing radiant energy" to an annealing zone on the surface encompassing the fusion zone. The annealing radiant energy retards cooling of the fusion zone and limits thermal stress occurring in the article adjacent to the fusion zone during the cooling. Most preferably, the annealing radiant energy is effective to limit thermal stress during cooling to less than the breaking stress of the ceramic material in the article at the surface, so that the cooling can be accomplished without inducing cracks in the surface. Methods according to this aspect of the present invention most preferably also include the step of preheating the fusion zone by applying other radiant energy, referred to herein as "preheating radiant energy" to a preheating zone on the surface encompassing the fusion zone before the fusing step, i.e., before applying the fusing radiant energy, thereby preheating the fusion zone and limiting thermal stress in the article adjacent to the fusion zone during the fusion step. Most preferably, the bulk temperature of the article—the temperature of those portions not affected by the radiant energy—is maintained far below the melting temperature of the ceramic materials at the surface, and typically, below the annealing and softening temperatures of any vitreous materials at the surface. Most preferably, the bulk temperature of the article is maintained at about room temperature, and the article as a whole is not heated in the process.

This aspect of the present invention incorporates the realization that thermal stresses can be successfully controlled through appropriate control of the radiant energy application. Most preferably, the annealing zone and the preheating zone are larger than the fusion zone. That is, the annealing radiant energy and the preheating radiant energy desirably are applied over a larger zone of the surface than the fusion radiant energy, so that the preheating and annealing radiant energies affect not only the fusion zone itself but also the area surrounding the fusion zone. The annealing radiant energy desirably has a power density lower than the fusing radiant energy. The preheating radiant energy also may have a power density lower than the power density of the fusing radiant energy. The power density of the annealing radiant energy may decrease progressively during the annealing step, whereas the power density of the preheating radiant energy may increase progressively in the preheating step. Thus, the region including the zone to be glazed may be first exposed to preheating radiant energy over a relatively large zone with low but progressively increasing power density, than exposed to the fusion radiant energy at a relatively high power density sufficient to induce localized melting at only the small fusion zone and then exposed to annealing radiant energy over a relatively large annealing zone with progressively decreasing power density.

Stated another way, by varying the radiant energy conditions applied to a given region of the surface with time, it is possible to bring the surface up to the melting temperature and back down again to room temperature without inducing destructive thermal stress.

The fusing and annealing steps can be performed using a single beam of radiant energy directed to impinge at a fixed location on the surface of the article. The configuration of the beam is varied with time so that the beam has a relatively high power density during the fusing step and a lower power density during the annealing step. Desirably, the beam has a relatively small fusing beam diameter during the fusing step and a larger, annealing beam diameter during at least the last part of the annealing step. The same beam may also perform the preheating step, in which case the beam desirably has a relatively large preheating beam diameter, larger than the fusing beam diameter during the initial part of the preheating step. The configuration of the beam may be varied by varying the focus of an optical element directing the beam onto the surface, so as to defocus the beam during the preheating and annealing steps, and more narrowly focus the beam during the fusing step. Desirably, the diameter of the beam during the fusing step is about 10 mm or less, more desirably about 0.1 to 5.0 mm, and the fusion zone where melting occurs has equal or smaller diameter. The annealing beam diameter, and hence the diameter of the annealing zone preferably is between about 1 mm and about 15 mm, but in each case substantially larger than the diameter of the beam during the fusing step. The preheating beam diameter and preheating zone are of comparable dimensions to the annealing beam diameter and annealing zone. The radiant energy desirably has a power density of at least about 200 W/cm$^2$ during the fusing step, whereas the radiant energy applied during the annealing step desirably has a time-average power density of less than 200 W/cm$^2$. Desirably, the power density used during the annealing step decreases progressively to zero during such step. The annealing step desirably has a substantial duration, preferably between about 0.5 seconds and about 10 seconds, more preferably between 1 second and 5 seconds. The fusion step typically is considerably shorter, most preferably between about 0.1 and about 1.0 seconds. The preheating step typically has a duration equal to or less than the duration of the annealing step, most commonly between about 0.25 and about 2.5 seconds. Thus, the time required to treat each portion of the surface normally is considerably less than 15 seconds, and ordinarily less than about 5 seconds.

The fusing and annealing steps may be conducted on a continuous or semicontinuous basis using relative motion between the radiant energy beam and the article to be treated. This arrangement employs at least one beam of radiant energy arranged to include the fusing radiant energy at a relatively high, fusing power density in a fusing region, and also including the annealing radiant energy at an annealing power density less than the fusing power density in an annealing region adjacent to the fusing region but offset therefrom in a first direction. The surface of the ceramic article is moved in the first direction relative to the at least one beam of radiant energy so that successive portions of the surface pass through the fusing region and then pass through the annealing region. Desirably, the at least one beam further includes preheating radiant energy at a preheating power density less than the fusing power density in a preheating region adjacent to the fusing region but offset from the fusing region in a second direction, opposite from the first direction. Thus, each portion of the surface passing through the fusing and annealing regions will first pass through the preheating region before entering the fusing region. The preheating and fusing regions preferably are contiguous and the fusing and annealing regions also may be contiguous. The preheating, fusing and annealing regions may all be provided as portions of a single radiant energy beam, such as a beam having a substantially Gaussian distribution of power density in the first and second directions. The moving step may be conducted so that each portion of the surface passes through the preheating, fusing and annealing regions during a transit time of between about 2 and about 10 seconds. Desirably, the transit time through the preheating, fusing, and annealing regions defined by the beam or beams is such as to provide preheating, fusing and annealing steps having the durations set forth above.

The ceramic article treated desirably has a vitreous, meltable material such as a glaze at its surface, and the ceramic material melted during the fusing step includes a portion of the glaze falling within the fusing zones. Where the glaze has defects in the nature of small cracks or holes, the molten material seals over the imperfections and provides a surface having the appearance of a perfect, continuous glaze. Additional material can be provided in the form of a powdered vitreous material or frit at the surface in or adjacent to the zone treated by the radiant energy. The additional material desirably fuses with the material of the article itself. The glaze and/or the additional vitreous material may incorporate essentially any glazes used for decorative and/or sanitary purposes on ceramic articles, such as the common glass-forming compositions incorporating components selected from the group consisting of $SiO_2$, $Al_2O_3$, $B_2O_5$, PbO and the oxides of sodium, potassium, calcium, magnesium, chromium, phosphorous and zirconium.

A further aspect of the present invention provides apparatus for carrying out processes as discussed above.

DETAILED DESCRIPTION OF THE PREFERRED EMBODIMENTS

Apparatus in accordance with one embodiment of the present invention incorporates a laser 10. Laser 10 is arranged to emit light within a band of wavelengths which is absorbed, at least in part by the material present at the surface of the workpiece to be treated while such material is in the solid state. For glazes such as those found on conventional whiteware and for other ceramics, wavelengths in the infrared region of the spectrum are strongly absorbed and hence are preferred. High power infrared lasers include YAG or yttrium aluminum garnet lasers, which typically operate at 1.06 micron wavelengths and $CO_2$ lasers, which typically operate at 10.6 microns wavelength. Either of these may be employed. $CO_2$ lasers are preferred inasmuch as the same are comparatively inexpensive and readily available. One suitable $CO_2$ laser is sold under the trademark SURGI-LASE by Surgilase Incorporated of Warwick, R.I.

Figure 1:
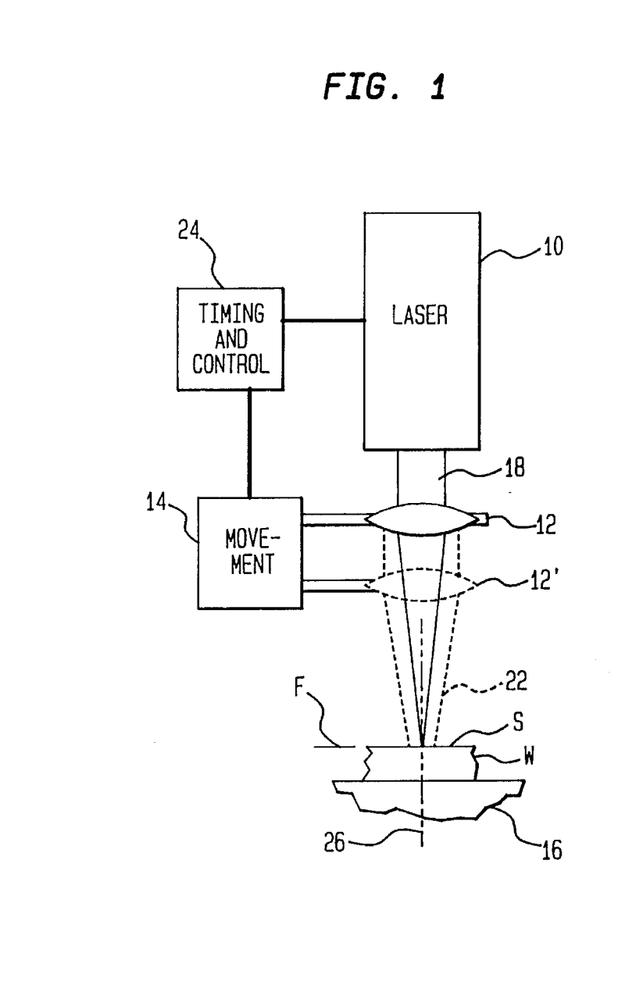
FIG. 1 is a diagrammatic elevational view of apparatus in accordance with one embodiment of the present invention.

Laser 10 is provided with a variable focus optical system 12 and with apparatus 14 for moving the elements of the variable focus lens system. Lens system 12 is schematically illustrated in FIG. 1 of a simple, movable, single element lens. In practice, the variable focus optical system may incorporate more complex arrangements of optical elements, such as a multi-element zooming lens, or variable geometry arrangements of mirrors. The variable focus system of the type commonly used as a variable power density element or "microsurgery adapter" with the aforementioned SURGI-LASE laser unit can be employed. Movement apparatus 14 incorporates appropriate servo motors, linear actuators and the like for operating the moveable elements of the variable focus lens system 12.

The treatment apparatus further includes a workpiece support 16 adapted to support the articles to be treated in preselected spatial relationship with the lens system 12. The configuration of the lens system and the position of support 16 are selected so that when a workpiece W is held by a workpiece support 16 a surface S of the workpiece is disposed at a preselected focal plane F, having a preselected spatial relationship to the lens system 12. The optical system 12 is arranged so that when the system is in a first position, as shown in solid lines in FIG. 1, a light beam 18 emanating from laser 10 will be projected along a beam axis 26 and focused to a relatively narrow spot 20 surrounding axis 26 at focal plane F and surface S, whereas when lens system 12 is in a second position, illustrated schematically in broken lines at 12' in FIG. 1, the light beam 18 will be projected along the same beam axis 26 but defocused slightly to cover a somewhat larger spot 22 surrounding axis 26 at focal plane F and surface S. Laser 10 and movement apparatus 14 are linked to a timing and control device 24, having appropriate features for actuating the movement device and the laser in a predetermined sequence, and for controlling the total power applied by laser 10 in its outgoing beam 18 during each such cycle of operations. Most preferably, the timing and control device and laser 10 are arranged to turn laser 10 on and off, and to operate laser 10 with continuously variable total radiated power in beam 18.

In a method according to one embodiment of the invention, workpiece W is disposed on support 16 as aforesaid, so that its top surface S lies in the aforementioned focal plane F, and so that the top surface of the workpiece extends substantially perpendicular to beam axis 26. As illustrated, workpiece W has a base layer 28 of a ceramic material and a glaze layer 30 overlying the base layer and defining the top surface S of the workpiece. The glaze layer typically is between about 0.05 mm and about 0.5 mm thick, and desirably at least about 0.1 mm thick, whereas the underlying base layer 28 ordinarily is many times thicker than the glaze layer. Glaze layer 30 consists essentially of a glassy, vitreous ceramic material. This material typically includes, but is not limited to, one or more constituents selected from the group consisting of $SiO_2$, $Al_2O_3$, $B_2O_5$, PbO, $Na_2O$, $K_2O$, CaO, MgO and combinations thereof, and may also include other ingredients such as pigments or opacifiers. One common, workable type of glaze material is the type commonly referred to as refire glaze.

The material of glaze layer 30 desirably has physical properties in accordance with the properties shown in Table I, below.

TABLE I

| Property | Desirable | Most Preferred |
| --- | --- | --- |
| Refire Temperature | <1500° C. | <1200° C. |
| Density | Any value | 2.3 gm/cm$^3$ |
| Coefficient of Linear Expansion | >10$^{-5}$/°C. | about 3.0 × 10$^{-6}$/°C. or less |
| Thermal Conductivity | >0.1 W/cm-°C. | about .035 W/cm-°C. or less |

The refire temperature referred to in Table I is the temperature at which the top layer material will flow and "self heal" so as to close gaps or fissures in a short period of time. The refire temperature thus corresponds to the temperature at which the viscosity of the material drops below about 3000 poise.

Underlayer 28 may incorporate essentially any material compatible with the surface layer 30. As further described below, the effects which occur during the process are substantially confined to the top of the surface layer, i.e., to that portion of layer 30 within about 1 mm of the top surface. Where the top layer 30 has a thickness substantially greater than this distance, effects such as thermal expansion caused by the localized heating at the top surface do not propagate substantially into the base layer and, conversely, effects such as thermal conduction in the base layer do not appreciably influence the heating and cooling processes. In that case, the properties of the base material are unimportant to the process. Where the top layer 30 is less than about 0.1 mm thick, so that the heating process will substantially interact with the base layer 28, then the base layer should desirably have physical properties as set forth above for the top layer. Typical base layers include aluminosilicate/silica ceramics such as clay/feldspar/flint mixtures as used for common whiteware, as well as cast iron and such composites as porcelain enameled surface material with acrylic backing for which AMERICAST® is the registered trademark of American Standard, Inc.

Figure 2:
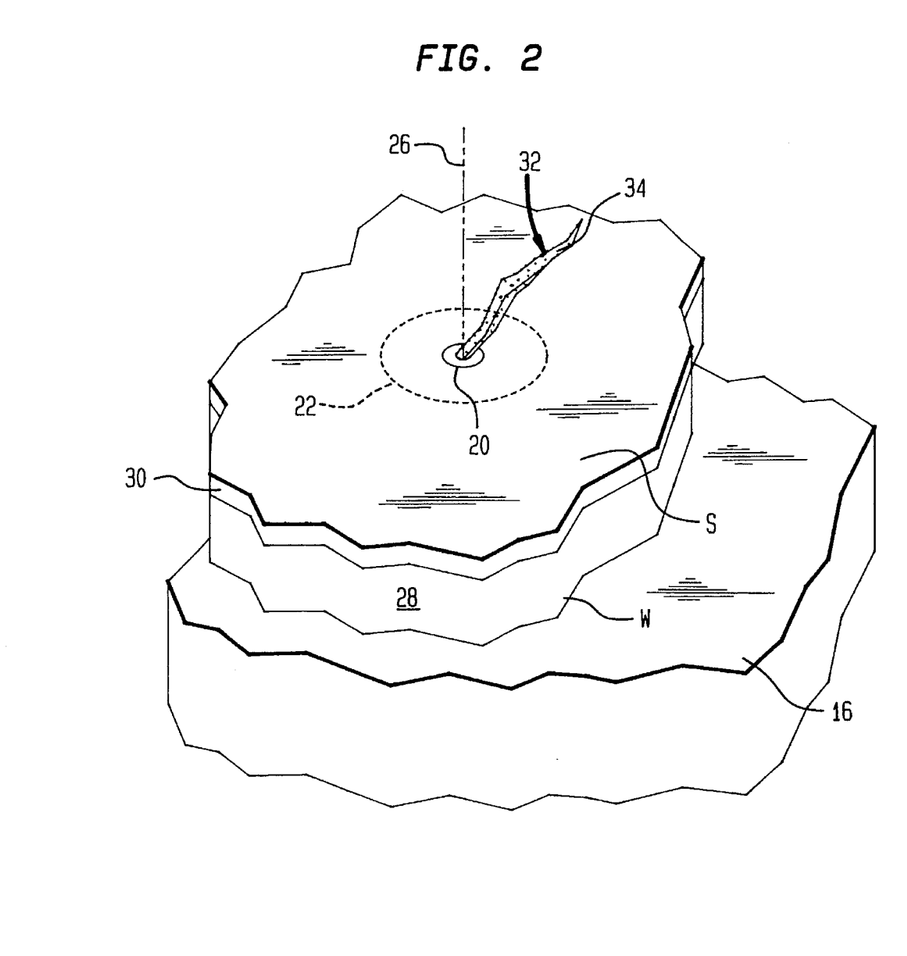
FIG. 2 is a diagrammatic perspective view depicting stages in operation of the apparatus of FIG. 1.

As seen in FIG. 2, the particular workpiece being treated has a defect in layer 30 in the form of a crack or fissure 32. A repair material or frit 34 is disposed on the top surface S of the workpiece at and adjacent the defect 32. Frit 34 may include the same material as is present in the top layer 30 of the workpiece, or another material which is chemically and physically compatible with the material of the top layer, so that undesired chemical reactions do not occur when these two materials contact one another in the molten state. Most preferably, the frit, and any intermediate mixture of the frit and the top layer material have physical properties (including coefficient of expansion) close to those of the top layer material itself. The refire temperature of the frit and/or the refire temperature of a mixture of the frit and the top layer material may be lower than the corresponding refire temperature of the top layer material itself. There is essentially no lower limit (other than the service temperature of the finished article) for the refire temperature of the frit. Where the aesthetic properties of the finished article are important, the repair material may be selected to provide a good color match with the material of the top layer.

The workpiece is aligned with the optical apparatus 12 so that a part of the workpiece surface S where treatment is desired is aligned with the beam axis 26. As illustrated in FIG. 2, this part may include a portion of defect 32. Timing and control device 24 actuates movement device 14 to bring the optical apparatus 12 to the second or defocused position 12', and actuates laser 10 to apply a beam of preheating radiant energy. This preheating radiant energy initially is focused onto the relatively large zone or spot 22 surrounding beam axis 26, thereby applying preheating radiant energy over a preheating zone having a diameter substantially equal to the beam diameter, i.e., substantially equal to the diameter of spot 22.

The beam of radiant energy may have a substantially Gaussian distribution of power density, so that the power density of the beam decreases gradually with distance from axis 26, with no sharp drop or cut-off. In that case, the radius of the beam is taken as the point where the power density is 1/e times its peak value, i.e., where the power density is 0.368 times the power density at the center of the beam. Thus, the diameter of the beam, and hence the diameter of the spot illuminated by the beam, can be taken as twice this radius. The diameter calculated in this manner is referred to in the present disclosure as the "1/e diameter." Unless otherwise specified, beam diameters referred to in this disclosure are 1/e beam diameters. Also, the term "power density," as used in this disclosure with reference to a radiant beam of non-uniform power density, means the average power density within the beam diameter.

The preheating radiant energy thus is applied to a preheating zone on the top surface coterminus with spot 22 during this initial portion of the preheating stage of the process. The preheating beam diameter, and hence the diameter of the preheating spot or zone 22 desirably is between about 1 mm and about 15 mm, and more preferably, about 2 mm and about 10 mm at the beginning of the preheating step. As the preheating step continues, the timing and control unit actuates laser 10 to progressively increase its total power output, and actuates movement apparatus 14 to progressively bring the apparatus from its second position 12' to its first position 12, thereby progressively narrowing the focus of the beam from the large spot 22 to relatively narrow spot 20. Thus, the average power density within the beam at the top surface of the work piece progressively increases during the preheating step. The power density typically begins at a very low value, approximately 0, and progressively increases, during this preheating step, to about 200 watts per square centimeter. At the same time, the diameter of the beam decreases from the initial preheating beam diameter to a final preheating beam diameter equal to the fusing beam diameter discussed below. Preferably, the duration of the preheating step is about 0.25 to about 2.5 seconds.

Immediately after the preheating step, a fusing step begins. In the fusing step, the timing and control apparatus actuates the movement device to maintain the optical apparatus 12 at its first or narrow-spot position, thereby maintaining the light beam from laser 18 as focused on the relatively small diameter spot 20 surrounding beam access 26. Thus, the diameter of the beam at the work piece surface is maintained at a fusing beam diameter less than about 10 mm, and desirably between about 0.1 mm and about 4 mm. Thus, the light beam from laser 10 is applied substantially in a relatively small diameter fusing zone coterminus with spot 20. In this stage of the process, the timing and control unit maintains laser 10 at a relatively high, constant total power output. Thus, a relatively high, constant power density is applied within fusing zone 20. During this stage of the process, the material of top layer 30 and the repair material 34 within fusing zone 20 at the top surface of the work piece reach their reflow temperatures, melt and form a continuous liquid phase at the surface. This stage of the process typically lasts about 0.1 to about 1 second, and most preferably about 0.5 seconds. Desirably, the power density applied in this stage of the process is above 200 watts per square centimeter, and more desirably between about 200 and about 400 watts per square centimeter. The total power desirably is between about 5 and about 20 watts in the fusing step, and the total energy input to the fusion zone desirably is about 2.5 to about 10 J. The total power and power density applied in the fusing step should not be so great as to cause substantial evaporation of the more volatile components in the top layer material of the work piece, or in the repair material. However, the molten materials typically have substantially lower absorptivity for the radiant energy of the beam than the solid materials. The molten materials tend to absorb a smaller fraction of the incident radiant energy, and to reflect a greater fraction of such incident energy. This tends to provide a self-limiting effect, and to prevent overheating of the molten material. As the surface in the fusion zone and immediately surrounding the fusion zone is at a highly elevated temperature during the fusing step, and those portions of top layer 30 remote from the fusion zone are at the bulk temperature of the material, i.e., at about room temperature, there are substantial temperature differences among portions of top layer 30. The energy supplied to the surface in the preheating zone during the preheating step tends to mitigate the temperature gradients, and tends to prevent cracking due to thermal stresses in the fusing step. Although the present invention is not limited by any theory of operation, melting within the fusion zone is also believed to relieve thermal stress.

In an annealing step immediately following the fusion step, the timing and control unit actuates movement device 14 to begin moving the optical device 12 from its first or narrow-focus position to its second or wide-focus position, so as to gradually increase the diameter of the beam incident on the top surface of the work piece. Thus, by the end of this annealing step, the beam has reached a final annealing beam diameter substantially larger than the fusing beam diameter used in the fusing step. Preferably, the annealing beam diameter at the termination of the annealing step is between about 1 mm and about 15 mm, and more preferably between about 2 and about 12 mm. Desirably, the annealing beam diameter is about 1.2 to about 2.0 times the fusing beam diameter, and the preheating beam diameter is approximately the same as the annealing beam diameter. Thus, during the annealing step, radiant energy is applied on an annealing zone larger than the fusion zone and encompassing the fusion zone. Also during this annealing step, the total power output from laser 10 is progressively reduced. Thus, during the annealing step, the power density decreases progressively from the level applied during the fusing step. Desirably, the time average power density during the annealing stage of the process is considerably less than 200 w/cm$^2$. In the annealing step, the power density is progressively reduced to zero. Desirably, the annealing step has a duration of about 0.5 seconds to about 10 seconds, more preferably between about 1 second and about 5 seconds, and most preferably, about 2.5 seconds. During the annealing step, the fusion zone cools and the liquid phase formed during the fusion step solidifies. The radiant energy applied to the annealing zone during the annealing stage of the process moderates the rate of cooling of the fusion zone and of the surrounding areas, and also relieves the thermal stresses arising during this cooling process. Under the preferred conditions discussed above, the annealing radiant energy is effective to keep the tensile and compressive cooling stresses below the tensile and compressive strengths of the top layer material, respectively. Thus, the thermal stresses arising during cooling do not cause cracking of the top layer or of the newly formed solid phase. Although the term "annealing" is used with reference to this stage of the process, the present invention is not limited by any theory of operation. Thus, the term "annealing" as used with reference to this stage of the process should not be understood as necessarily requiring that the annealing stage include gradual flow or relaxation of stresses, as may occur during a classical, large-scale annealing process.

Once the annealing step has been concluded, the process can be repeated on another part of the work piece. For example, the workpiece can be shifted relative to beam axis 26, as by moving support 16.

Figure 3:
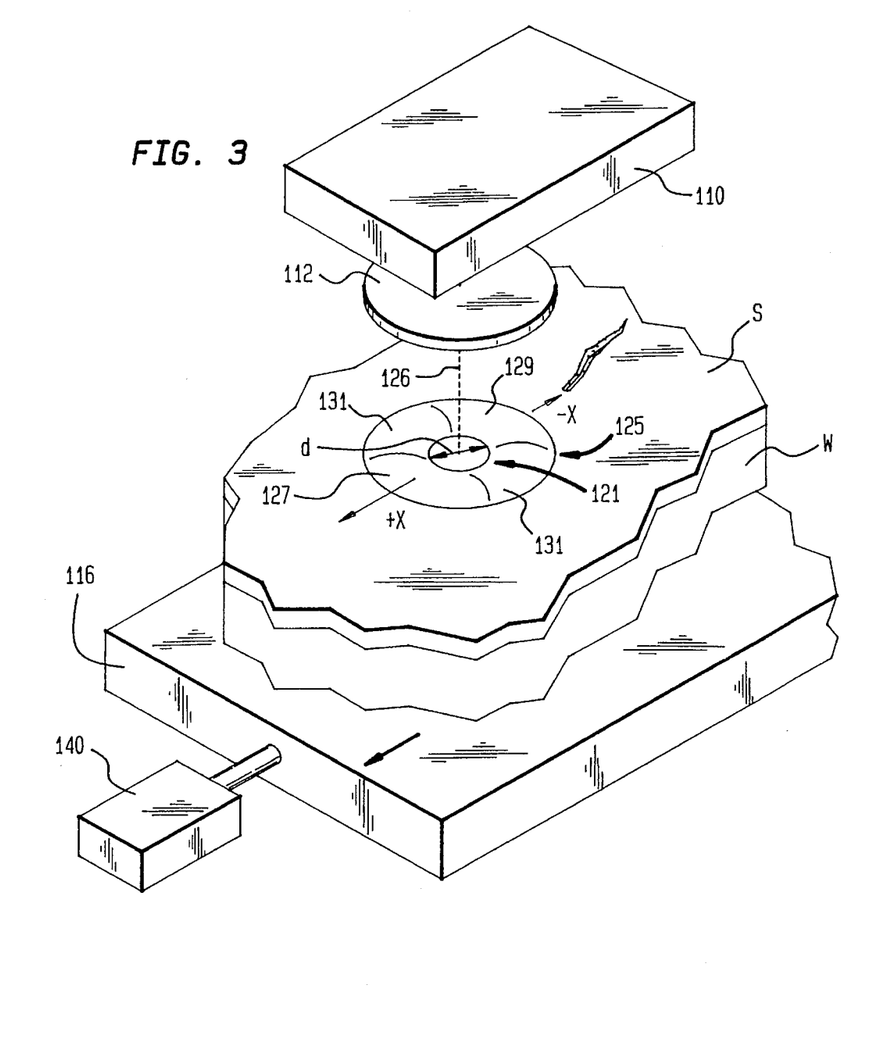
FIG. 3 is a fragmentary, diagrammatic, perspective view of apparatus in accordance with a further embodiment of the invention.
Figure 4:
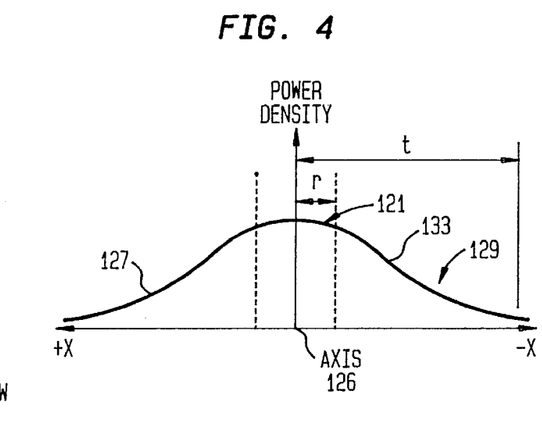
FIG. 4 is a graph illustrating power distribution in a light beam.

Apparatus according to a further embodiment of the invention is illustrated in FIG. 3. This apparatus includes a laser 110 similar to laser 10 discussed above and a fixed focus optical system 112 arranged to direct the beam from laser 110 along a fixed optical axis 126 and to focus the beam to a spot 121 of fixed diameter D at the focal plane. The fixed focus optical system thus provides a high power density within a fusion region corresponding to spot 121. However, because the power distribution of the beam is substantially Gaussian and substantially cylindrically symmetrical about beam axis 126, the focused beam provides appreciable power density in a broader, fringe region 125 surrounding fusing region 121. Some of this energy falls in an annealing region 127 contiguous with fusing region 121 but displaced therefrom in a first direction, indicated by the arrow "+X" in FIG. 3. Other portions of this energy fall in a preheating region contiguous with fusing region 121 but displaced therefrom in the second, opposite direction, indicated by the arrow "−X" in FIG. 3. Likewise, further portions of the energy in the beam fall in side regions 131 displaced from the fusing region in lateral directions, transverse to the first and second direction. Side regions 131 are contiguous with the pre-heating, fusing and annealing regions. Although the regions are illustrated in FIG. 3 clearly defined borders for clarity of illustration, it should be appreciated that these regions merge gradually into one another. The average power densities in each of annealing region 127 and preheating region 129 is lower than the average power density in fusing region 121. FIG. 4 is a graph depicting the power density of the radiation in the beam as a function of distance in the +X and −X directions from beam access 126. Curve 133 shows the power density.

The apparatus further includes a workpiece support 116 and a linear actuator 140 linked to support 116. Actuator 140 is arranged to move the support, and hence any workpiece positioned thereon, in the first or +X direction at a preselected movement rate.

In a method according to a further embodiment of the invention, a workpiece W is mounted on support 116 and moved, by the actuator 140, at a preselected, substantially constant movement rate. This movement sweeps the workpiece surface past the radiant energy beam so that each portion of the workpiece surface first passes through the preheating region 129 of the beam, then through the fusing region 121 and finally through the annealing region 127. Thus, before any zone of the workpiece surface enters the fusing region 121, that zone of the surface and adjacent zones of the workpiece surface have been preheated by exposure to the relatively low power density preheating radiation in preheating region 129 of the beam. As each zone passes through the fusing region 121 of the beam, such zone is exposed to the relatively high power density fusing radiation in the fusing region of the beam, whereupon the material at the workpiece surface is brought to its reflow temperature. At the same time, adjacent zones displaced laterally from the zone being treated in the fusing region of the beam are being exposed to the additional, relatively low power density radiation in the lateral regions 131. After each zone of the surface is exposed to the fusing radiant energy in fusing region 121, that zone of the surface passes into the annealing region 127 where such zone, as well as a surrounding, larger annealing zone of the surface are exposed to the relatively low power density annealing radiation. As best appreciated with reference to FIG. 4, as each zone of the workpiece surface travels in the +X direction (from right to left as seen in FIG. 4) such zone is exposed to progressively increasing power density as it passes through preheating region 129, and to progressively decreasing power density as it passes through annealing region 127.

The preheating and annealing steps in this process serve much the same function as those discussed above with reference to FIGS. 1 and 2. In this case, the significant parameters of the preheating and annealing steps, such as the intensity of the radiant energy applied in such steps, the rate of change of such intensity with time and the duration of such steps are controlled by the characteristics of the beam applied by laser 110 and optical system 112, as well as by the rate of movement of the workpiece surface. For treating materials having the properties discussed above, the beam desirably has a total power between about 5 and about 25 watts, more desirably between about 10 and about 20 watts, and a 1/e diameter of about 0.5 cm. The rate of movement of the surface in the first direction, transverse to the beam axis desirably is about 0.5 to about 2.0 mm/sec, and more desirably about 1.2 mm/sec. The transit time through the 1/e beam diameter, i.e., through the fusing region 121 desirably is between about 0.2 and about 2.0 seconds. In theory, the Gaussian power distribution of the beam extends to an infinite distance, and hence the preheating and annealing steps would be of infinite duration. In practice, however, the outer boundary of the fringe area 125 of the beam can be taken as lying at a distance equal to about 2.5 times the 1/e radius of the beam. Thus, the preheating region 129 can be taken as extending from about X=−1.25D to X=−D/2, whereas the annealing region 127 can be taken as extending from X=+D/2 to X=1.25D, where X is the distance from beam axis 126 and D is the 1/e beam diameter. The duration of the preheating and annealing steps, calculated as the transit times through these zones, should be between about 0.5 sec. and about 10 sec., more desirably between about 2 sec. and about 4 sec.

Figure 5:
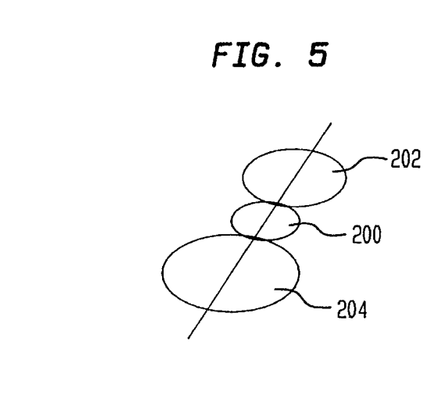
FIG. 5 is a diagrammatic view of a further light beam arrangement.

As will be readily appreciated, numerous variations and combinations of the features discussed above can be utilized without departing from the present invention as defined by the claims. In the arrangement of FIG. 3, relative movement between the radiant energy beam and the workpiece surface is provided by moving the workpiece while maintaining the beam fixed relative to a stationary frame of reference. Exactly the same effect can be achieved by keeping the workpiece stationary and moving the beam, as by directing the beam onto a mirror and progressively moving the mirror, or by using a flexible waveguide or by using a combination of mirrors as employed in an articulated arm in laser surgical instrumentation. In the arrangement of FIG. 3, the radiant energy is applied as a single, substantially Gaussian beam, the beam axis is perpendicular to the plane of the workpiece surface, so that the beam forms a circularly symmetrical pattern as illustrated. However, the spot formed by the beam on the surface need not be circular, but instead may be elliptical or asymmetrical, as where the beam axis is oblique to the workpiece surface plane. Indeed, the radiant energy need not be applied as a single beam. As illustrated in FIG. 5, a plurality of beams 200, 202 and 204 may be provided and directed respectively to fusing, preheating and annealing zones. Here again, the annealing region defined by beam 204 is offset from the fusing region defined by beam 200 in one direction, whereas the preheating region defined by beam 202 is offset in the opposite direction. In this illustration as well, the beams are drawn as having clearly defined borders. In fact, the fringe regions of the various beams would overlap in the fusing region. As illustrated, beam 202 has a slightly smaller diameter than beam 204, so as to provide a preheating time shorter than the annealing time.

In a further variant, the preheating stage can be omitted. Thus, in a varying beam arrangement such as that of FIGS. 1 and 2, the beam can be started in its fusing configuration whereas inswept beam arrangements as shown by FIGS. 3–5 the preheating region of the beam can be omitted. This variant is generally undesirable as it subjects the material to substantially higher thermal stresses during the initial portion of the fusing step. However, where the material has particularly favorable characteristics, such as very low coefficient of thermal expansion and/or very high strength, these stresses sometimes can be tolerated. Also, in the arrangement of FIGS. 1 and 2, the focus of the beam at the workpiece surface can be adjusted by moving the workpiece towards or away from the optical system.

The methods discussed above are used to repair defects in the glaze. The same methods can be employed to add glazing in localized areas. For example, a frit of contrasting color may be fused to a glaze to provide localized materials on a glaze surface. These techniques can be used with workpiece surfaces other than a glaze. For example, the treated article may be a solid slab of glass or other vitreous material.

As these and other variations and combinations of the features described above can be utilized without departing from the present invention as defined by the claims, the foregoing description of the preferred embodiments should be taken by way of illustration rather than by way of limitation of the invention as defined in the claims.

What is claimed:

1. Apparatus for treating a ceramic article comprising:
   (a) means for holding a ceramic article and maintaining the ceramic article at a bulk temperature below the annealing temperature of the article;
   (b) means for providing a beam of radiant energy and directing said beam of radiant energy onto only a portion of a surface of said article so that said beam at said surface has one or more beam dimensions and a power distribution; and
   (c) means for adjusting said beam directing means so that said beam at said surface in said region has a preheating beam dimension during a preheating period, then has a fusing beam dimension smaller than said preheating beam dimension during a fusing period later in time than said preheating period and then has an annealing beam dimension larger than said fusing beam dimension during an annealing period later in time than said fusing period, and so that said radiant energy in the beam causes melting within said portion of said surface while the article is maintained at said bulk temperature by said holding and maintaining means.

2. Apparatus as claimed in claim 1 wherein said means for adjusting is constructed and arranged to progressively increase total power in said beam while adjusting said beam dimension from said preheating beam dimension to said fusing beam dimension, and to progressively reduce total power in said beam while adjusting said beam dimension from said fusing beam dimension to said annealing beam dimension.

3. Apparatus for treating the surface of a ceramic article comprising:
   (a) means for providing at least one beam of radiant energy including fusing radiant energy at a fusing power density in a fusing region and also including annealing radiant energy at an annealing power density less than said fusing power density in an annealing region adjacent to said fusing region but offset therefrom in a first direction;
   (b) means for holding a ceramic article and maintaining the ceramic article at a bulk temperature below the annealing temperature of the ceramic article; and
   (c) means for providing relative motion between said at least one beam and said ceramic article held by said means for holding and maintaining so that the surface of said article moves relative to at least one beam and so that successive portions of the surface of said ceramic article pass through said fusing region and then through said annealing region and so that said portions of said surface are heated sufficiently to melt while said article is maintained at said bulk temperature by said means for holding and maintaining.

4. Apparatus as claimed in claim 3 wherein said means for providing at least one beam further includes means for providing preheating radiant energy at a preheating power density less than said fusing power density in a preheating region adjacent to said fusing region but offset therefrom in a second direction opposite from said first direction, whereby each said portion of said surface will pass through said preheating region before passing through said fusing region.

\* \* \* \* \*

UNITED STATES PATENT AND TRADEMARK OFFICE
CERTIFICATE OF CORRECTION

PATENT NO.    :   5,595,583
DATED         :   January 21, 1997
INVENTOR(S)   :   Murnick It is certified that error appears in the above-identified patent and that said Letters Patent is hereby corrected as shown below:

Column 1, line 25, change "unsealable" to read -- unsaleable --.

Column 6, Table I, under column entitled "Desirable," change ">$10^{-5}$/°C" to read -- <$10^{-5}$/°C --.

Column 6, Table I, under column entitled "Desirable," change ">0.1 W/cm-°C" to read -- <0.1 W/cm-°C --.

Signed and Sealed this

Fifteenth Day of April, 1997

Attest:

BRUCE LEHMAN

*Attesting Officer*     *Commissioner of Patents and Trademarks*